United States Patent [19]
Carney et al.

[11] Patent Number: 5,232,144
[45] Date of Patent: Aug. 3, 1993

[54] APPARATUS FOR TAPE AUTOMATED BONDING

[75] Inventors: Francis J. Carney, Gilbert; Harry J. Geyer, Phoenix; Renee M. Gregg, Tempe, all of Ariz.

[73] Assignee: Motorola, Inc., Schaumburg, Ill.

[21] Appl. No.: 904,929

[22] Filed: Jun. 26, 1992

[51] Int. Cl.[5] .............................................. B23K 3/02
[52] U.S. Cl. ........................................ 228/6.2; 228/219
[58] Field of Search ............... 228/6.2, 180.2, 219; 219/85.18

[56] References Cited

U.S. PATENT DOCUMENTS

| | | | |
|---|---|---|---|
| 4,767,047 | 8/1988 | Todd et al. | 228/264 X |
| 4,979,664 | 12/1990 | Lyons et al. | 228/180.2 |
| 4,984,731 | 1/1991 | Imamura | 228/180.2 X |
| 5,120,391 | 6/1992 | Ishida | 228/6.2 X |

FOREIGN PATENT DOCUMENTS

| | | | |
|---|---|---|---|
| 158436 | 12/1981 | Japan | 228/219 |
| 288345 | 11/1990 | Japan | 228/219 |

Primary Examiner—Kenneth J. Ramsey
Attorney, Agent, or Firm—Miriam Jackson

[57] ABSTRACT

An improved TAB bond is achieved by an apparatus for tape automated bonding, comprising a thermode having a bonding surface. A shield is attached around the bonding surface. The shield is designed so that a nonoxidizing gas may be distributed in a bonding space defined by a plurality of tape leads on a tape positioned below the shield and a bonding area of a semiconductor chip positioned below the tape and the plurality of tape leads. In the bonding position the flow of the nonoxidizing gas removes substantially all of an ambient air in the bonding space.

21 Claims, 3 Drawing Sheets

APPARATUS FOR TAPE AUTOMATED BONDING

BACKGROUND OF THE INVENTION

This invention relates, in general, to an apparatus for tape automated bonding (TAB), including, but not limited to an apparatus for distributing a nonoxidizing gas and removing ambient air from a bonding area.

TAB is usually done by gang bonding of a plurality of leads attached to a tape to bumps on a semiconductor chip. This is done utilizing a means to apply heat and pressure to the plurality of leads of the tape and the bumps on the chip. The plurality of leads are typically tin plated and the bump is typically gold. A gold-tin eutectic bond is formed between the lead and the bump.

Although TAB bonding is very reliable, some TAB bonded devices still experience lead lifts, and nodules, and bump lifts. Lead lifts are due to inadequate lead to bump eutectic bonds. Nodules are extruded tin-gold lumps which could cause shorts between the the plurality of leads and the bump to the surface of the semiconductor chip, which are caused by insufficient melting or wetting of the tin causing insufficient wetting of the eutectic. Better wetting also will result in better adhesion which creates a more robust bond. Cracks formed in the metal interface between the bump and the semiconductor chip cause the bump to lift after temperature cycling or high temperature storage or other tests. Thus, it is desirable to improve the TAB bonding process to reduce or eliminate the lead lifts, nodules, and bump lifts.

SUMMARY OF THE INVENTION

An apparatus for tape automated bonding, comprising a means for applying pressure and heat to a bonding arrangement comprising a tape and a semiconductor chip for bonding a plurality of tape leads on the tape to the semiconductor chip and a means for removing substantially all of an ambient air around the bonding arrangement comprised of a means for distributing a non-oxidizing gas around the bonding arrangement and for shielding the bonding arrangement, wherein the means for removing is attached to the means for applying.

DETAILED DESCRIPTION OF THE DRAWINGS

Figure 1:
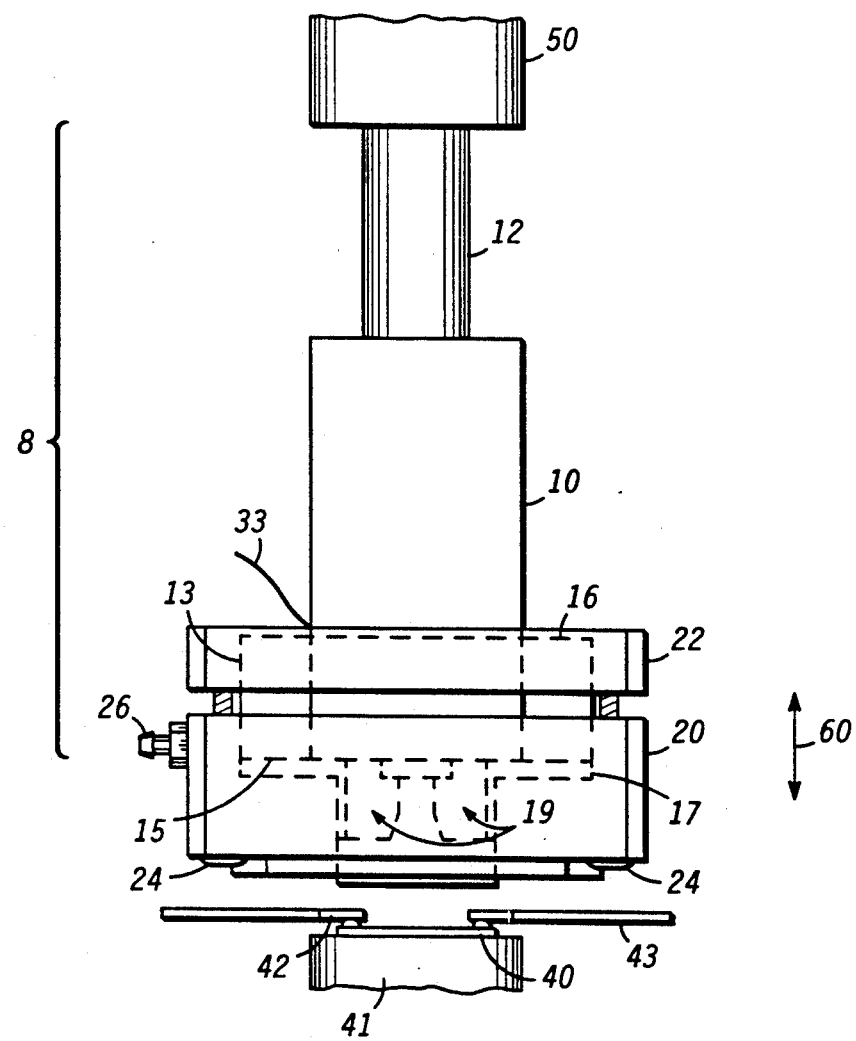
FIG. 1 illustrates a side-view of an apparatus according to one embodiment of the present invention.
Figure 2:
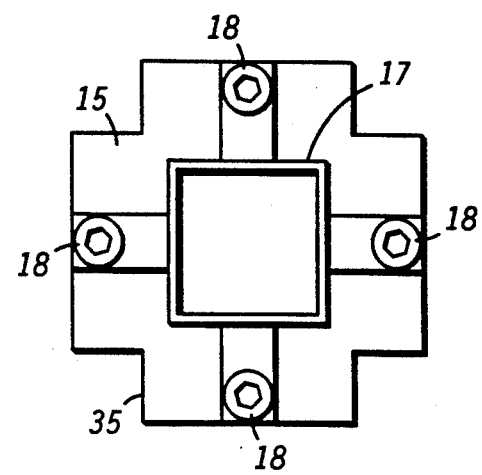
FIG. 2 illustrates a top-view of portions of an apparatus according to one embodiment of the present invention.

FIGS. 1-4 illustrate an embodiment of an apparatus of the present invention in various views. It may be helpful to refer to FIG. 4 throughout the description. FIG. 1 shows a side view of the apparatus. FIG. 1 shows a means for applying heat and pressure or a thermode 8, more particularly a pulse thermode. Thermode 8 having a body 10, a shaft 12, preferably cylindrical, positioned on a first end of body 10, and a base 13 positioned on a second end of body 10, opposite that of shaft 12. Thermode 8 is typically comprised of a conductive material, such as brass. Base 13 has a first surface 15 facing away from body 10 and a second surface 16 opposite that of first surface 15 facing toward body 10. Positioned on first surface 15 is a bonding surface or blade 17. FIG. 2 illustrates a top-view of first surface 15 and blade 17. Blade 17 is preferably positioned on or mechanically attached to first surface 15 by four screws 18. In this manner, blade 17 may be easily replaced or removed for maintenance when needed. Blade 17 is preferably comprised of a rigid, electrically and thermally conductive material, more preferably a refractory metal. It should be understood that other types of thermodes may be used. For example, a solid thermode (not shown) may be used. A solid thermode has a shaft which is made of stainless steel and a body made of a refractory metal. The bonding surface may be comprised of, for example, cubic boron nitride, single crystal diamond, or chemical vapor deposited polycrystalline diamond which is brazed to the body of the solid thermode.

Referring back to FIG. 1, thermode 8 is attached to a TAB bonder 50. Blade 17 is heated up to bonding temperature by electric current supplied by TAB bonder 50. The electric current is conducted through body 10. The temperature of blade 17 is sensed by a thermocouple and wire 33 attached to blade 17. Thermode 8, through blade 17, applies heat and pressure to a tape 43 having a plurality of tape leads 42 and to a semiconductor chip 40. The plurality of tape leads 42 and semiconductor chip 40 for a bonding arrangement. The plurality of tape leads 42 are typically comprised of tin plated lead. Gold bumps are typically formed on semiconductor chip 40, but can be formed on the plurality of tape leads 42. A tin-gold eutectic is formed which bonds the plurality of leads 42 and the bumps on semiconductor chip 40 together. Semiconductor chip 40 is typically held in place with a vacuum chuck 41. Blade 17 is configured to provide for openings 19 which allow for flow of the nonoxidizing gas therethrough (described with reference to shield 20).

Figure 3:
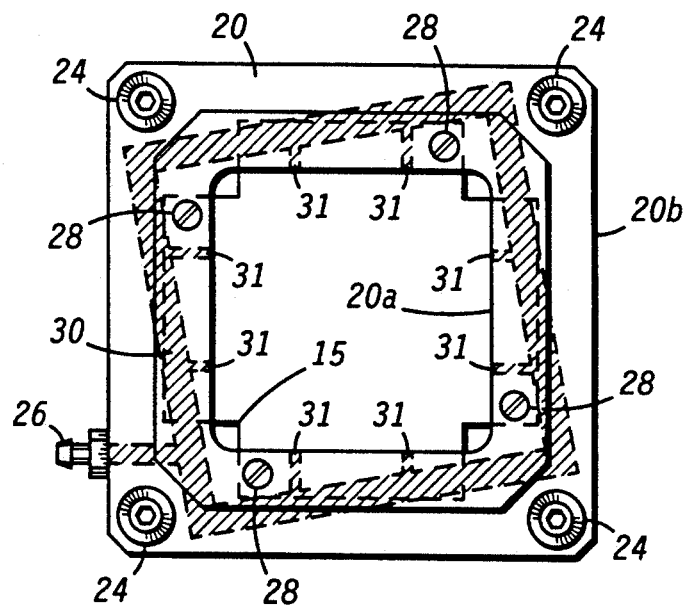
FIG. 3 illustrates a top-view of portions of an apparatus according to one embodiment of the present invention; and, FIG. 4 illustrates a perspective view of an apparatus according to one embodiment of the present invention.
Figure 4:
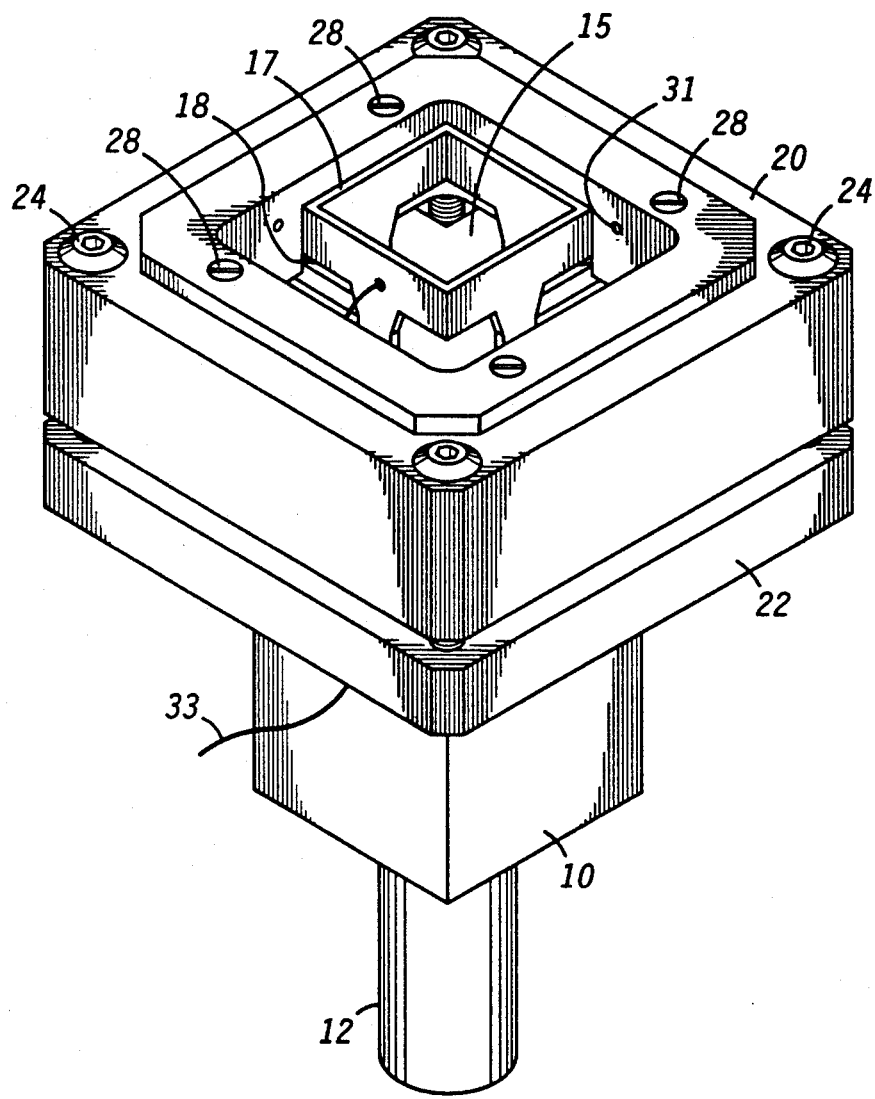

With reference to FIGS. 1 and 3, a shield 20 having an inside surface 20a, an outside surface 20b, and a bottom 20c is positioned on or mechanically attached around first surface 15 of base 13 and blade 17. Shield 20 is positioned so that it shields only a portion of blade 17 (in the horizontal direction). Shield 20 also has an entrance hole 26 formed in outside surface 20b for distributing a nonoxidizing gas to a bonding space defined by a plurality of tape leads 42 on a tape 43 positioned below shield 20 and a bonding area (the surface on semiconductor chip 40 where the plurality of tape leads 42 are bonded) of the semiconductor chip 40 positioned below tape 43 and the plurality of tape leads 42 by way of a conduit 30 formed in shield 20 and at least one exit hole 31 formed in inside surface 20a. In a preferred embodiment, a plurality of exit holes 31 are positioned so that the nonoxidizing gas may flow to the bonding area through openings 19 of blade 17. The nonoxidizing gas could also enter the bonding space through a porous ceramic or metallic material that could line portions of inside surface 20a. In this way, blade 17 is not subjected to direct flow of the nonoxidizing gas, which could result in undesirable cooling of blade 17.

During bonding, thermode 8 comes down and touches leads 43 so that blade 17 is putting pressure and heat on the plurality of leads 42. It is preferable, but not necessary that shield 20 not touch the plurality of leads 42 or tape 43 in this bonding position. A bonding space, the space where bonding of the plurality of leads 42 to semiconductor chip 40 takes place, is defined by shield 20, first surface 15, semiconductor chip 41 and tape 43. During bonding in the present invention, it is preferable that the nonoxidizing gas flows from exit holes 31 in the bonding space and out the bottom where bottom 20c of shield 20 does not touch tape 43 and between the plurality of leads 42. This creates a higher pressure in the bonding space which removes and keeps substantially all of the ambient air out of the bonding space. By keeping substantially all of the ambient air out of the bonding space, oxygen present in the ambient air is removed from the bonding space. Oxygen causes oxidation of the tin or tin lead and the gold-tin eutectic, which causes the formation of poor bonds. Without oxidation, the tin flows better, and the gold-tin eutectic melts better, thus resulting in a robust bond with reduced amount of lead lifts and nodules. More and better melting forms larger, more effective strain relief zones in the bumps which equilibrate force from blade 17 on the bumps. More melting also absorbs more of the heat from blade 17. Therefore, less heat goes to the metal interface between the bumps and semiconductor chip 40 and less force on the metal interface between the bumps and semiconductor chip 40. These are conditions that make cracking less likely and thus reduce bump lifts. In addition, blade 17, which is comprised of a refractory metal, can oxidize at 400° C. or higher. Oxidation of portions of blade 17 can lead to poor performance of the bonding process. By keeping most oxygen out of the bonding space, the life of blade 17 is also increased.

The nonoxidizing gas is preferably comprised of a reducing agent, such as hydrogen mixed with an inert gas, to further prevent the oxidation of the eutectic and molten tin. Preventing the oxidation of the eutectic makes the eutectic flow or wet better, thus preventing the formation of nodules. The flowrate of the nonoxidizing gas should be a flowrate where substantially all of the ambient air is removed, but where blade 17 is not cooled substantially so that it affects the bonding. The temperature of blade 17 must remain between 400° to 600° C. If blade 17 is cooled by the nonoxidizing gas, additional current may be supplied by TAB bonder 50 to generate more heat to compensate for the cooling, thus keeping the temperature of blade 17 within the range specified above.

Still with reference to FIGS. 1 and 2, shield 20 may be attached to base 13 in any manner, for example, with screws screwed directly into base 13. The preferred embodiment, however, is to provide a way for the vertical position of shield 20 to be easily changed, with respect to blade 17. This means that the position of the bottom 20c of shield 20 can be moved farther or closer relative to first surface 15. The vertical direction is shown in FIG. 1 by arrow 60. This preferred embodiment is shown in FIG. 1. Shield 20 is attached to a baseplate 22 by screws 24. Baseplate 22 fits around base 13 at second surface 16. Thus, shield 20 and baseplate 22 "sandwich" together base 13 of thermode 8. Shield 20 has a portion of inner surface 15 which contacts outside surface 35 of base 13. Shield 20 is substantially gas tight, sealing on base 13 along outside surfaces 35. When shield 20 is moved vertically as shown by arrow 60, a seal is maintained along outside surfaces 35. To allow for the position of shield 20 to be changed, jack screws 28 go through shield 20 and push against first surface 15 of base 13. Changing the height of shield 20 is preferable because blade 17 comes in different heights. In addition, blade 17 is sometimes ground and polished to remove any uneven surfaces formed on blade 17 from the wear of the bonding process, thus changing the height of blade 17.

Shield 20 is preferably comprised of a nonconductive, heat resistant material, and in the preferred embodiment of a glass filled teflon. Baseplate 22 is preferably comprised of a rigid material, and in the preferred embodiment of aluminum. If a solid thermode is used, shield 20 is preferably comprised of a machinable ceramic so that it can withstand a high temperature.

As can be seen, an apparatus for improving a TAB bond has been disclosed. By distributing a nonoxidizing gas in a bonding space and shielding it from the ambient air, a more robust bond is formed. Better wetting or melting of the gold-tin eutectic, as well as better tin flow, result in the reduction or elimination of lead lifts, nodules and cracks.

We claim:

1. An apparatus for tape automated bonding, comprising:
    a thermode having a bonding surface;
    a shield positioned on the thermode around the bonding surface, wherein the shield has an inside surface and an outside surface and a bottom, and is designed for distributing a flow of a nonoxidizing gas to a bonding space defined by a plurality of tape leads on a tape positioned below the shield and a bonding area of a semiconductor chip positioned below the tape and the plurality of tape leads, wherein the shield is designed for distributing the nonoxidizing gas around the bonding space through at least one entrance hole formed in the outside of the shield, a conduit formed in the shield, and at least one exit hole formed in the inside surface of the shield.

2. The apparatus of claim 1 wherein the at least one exit hole is positioned in the shield so that the nonoxidizing gas does not directly blow on the bonding surface.

3. The apparatus of claim 1 wherein the shield cooperates with the semiconductor chip and the tape so that the position of the shield relative to the position of the semiconductor chip and the tape and a flowrate of the nonoxidizing gas is such that the ambient air is substantially removed from the bonding space.

4. The apparatus of claim 1 further comprising a means for supplying the nonoxidizing gas which cooperates with the shield and wherein the nonoxidizing gas is comprised of a hydrogen gas mixed with an inert gas.

5. The apparatus of claim 1 wherein the shield cooperates with the semiconductor chip and the tape so that the bottom of the shield does not touch the tape when the apparatus is in a bonding position.

6. An apparatus for tape automated bonding, comprising:
    a thermode having a bonding surface;
    a shield positioned on the thermode around the bonding surface, wherein the shield has an inside surface and an outside surface and a bottom, and is designed for distributing a flow of a nonoxidizing gas to a bonding space defined by a plurality of tape leads on a tape positioned below the shield and a bonding area of a semiconductor chip positioned below the tape and the plurality of tape leads, wherein the thermode is comprised of a body, a shaft positioned on a first end of the body of the thermode, and a base positioned on a second end of the body of the thermode, wherein the base has a first surface facing away from the body and a second surface facing toward the body and the thermode bonding surface is positioned on the first surface of the base and the shield is positioned on the base around the first surface of the base and around the thermode bonding surface.

7. The apparatus of claim 6 wherein the shield is mechanically attached to the base around the first surface by having a baseplate positioned around the second surface of the base of the thermode and attached to the shield by at least one screw.

8. The apparatus of claim 6 wherein the position of the bottom of the shield can be moved closer or farther from the first surface of the base by at least one screw which is threaded through the shield and pushes against the first surface of the base of the thermode.

9. The apparatus of claim 6 wherein the shield is mechanically attached to the base around the first surface by at least one screw.

10. The apparatus of claim 6 wherein substantially all of an ambient air in the bonding space is removed by the flow of the nonoxidizing gas.

11. An apparatus for tape automated bonding, comprising:
a thermode having a body, a shaft positioned on a first end of the body of the thermode, and a base positioned on a second end of the body of the thermode, wherein the base has a first surface facing away from the body and a second surface facing toward the body;
a thermode bonding surface positioned on the first surface of the base; and
a shield positioned on the base around the first surface of the base and around the thermode bonding surface having a means for supplying a nonoxidizing gas, wherein the shield has an inside surface and an outside surface and a bottom, and further wherein the shield is designed for distributing the nonoxidizing gas around a bonding space below said bonding surface through at least one entrance hole formed in the outside of the shield, a conduit formed in the shield, and at least one exit hole formed in the inside surface of the shield, wherein the bonding space is defined by a plurality of tape leads on a tape positioned below the shield and a bonding area of a semiconductor chip positioned below the tape and the plurality of tape leads, and wherein substantially all of an ambient air in the bonding space is removed by the flow of the nonoxidizing gas.

12. The apparatus of claim 11 wherein the shield is mechanically attached to the base around the first surface by having a baseplate positioned around the second surface of the base of the thermode and attached to the shield by at least one screw.

13. The apparatus of claim 12 wherein the position of the bottom of the shield can be moved closer or farther from the first surface of the base by at least one screw which is threaded through the shield and pushes against the first surface of the base of the thermode.

14. The apparatus of claim 11 wherein the shield is mechanically attached to the base around the first surface by at least one screw.

15. The apparatus of claim 1 wherein the at least one exit hole is positioned in the shield so that the nonoxidizing gas does not directly blow on the bonding surface.

16. The apparatus of claim 11 wherein the position of the shield relative to the position of the semiconductor chip and the tape and a flowrate of the nonoxidizing gas is such that the ambient air is substantially removed from the bonding space.

17. The apparatus of claim 11 wherein the nonoxidizing gas is comprised of a hydrogen gas mixed with an inert gas.

18. The apparatus of claim 12 wherein the shield does not touch the tape when the apparatus is in a bonding position.

19. An apparatus for tape automated bonding, comprising:
a means for applying pressure and heat to a bonding arrangement comprising a tape and a semiconductor chip for bonding a plurality of tape leads on the tape to the semiconductor chip;
a means for removing substantially all of an ambient air around the bonding arrangement comprised of a means for supplying and distributing a nonoxidizing gas around the bonding arrangement and for shielding the bonding arrangement, cooperating with the means for applying heat and pressure, and comprised of a shield having an inside surface and an outside surface and a bottom, and further wherein the means for distributing the nonoxidizing gas is comprised of at least one entrance hole formed on the shield, a conduit formed in the shield, and at least one exit hole formed in the inside surface of the shield.

20. The apparatus of claim 19 wherein the means for applying pressure and heat is comprised of a thermode and a bonding surface.

21. The apparatus of claim 19 wherein the nonoxidizing gas is comprised of a hydrogen gas mixed with an inert gas.

* * * * *

UNITED STATES PATENT AND TRADEMARK OFFICE
CERTIFICATE OF CORRECTION

PATENT NO. : 5,232,144
DATED : August 3, 1993
INVENTOR(S) : Carney et al.

It is certified that error appears in the above-indentified patent and that said Letters Patent is hereby corrected as shown below:

Claim 15, column 6, line 14, "Claim 1" should read --Claim 11--.

Signed and Sealed this

Fourth Day of October, 1994

BRUCE LEHMAN

*Attest:*

*Attesting Officer*     Commissioner of Patents and Trademarks